United States Patent
Wu et al.

(10) Patent No.: US 8,218,304 B2
(45) Date of Patent: Jul. 10, 2012

(54) DISPLAY DEVICE AND METHOD FOR ASSEMBLING THE SAME

(75) Inventors: Chia-Hsien Wu, Taipei (TW); Yi-Jen Chen, Taipei (TW); San-Ho Lu, Taipei (TW)

(73) Assignee: Unihan Corporation, Beitou District, Taipei (TW)

( * ) Notice: Subject to any disclaimer, the term of this patent is extended or adjusted under 35 U.S.C. 154(b) by 313 days.

(21) Appl. No.: 12/612,682

(22) Filed: Nov. 5, 2009

(65) Prior Publication Data

US 2010/0110624 A1 May 6, 2010

(30) Foreign Application Priority Data

Nov. 5, 2008 (TW) ................................ 97142774 A

(51) Int. Cl.
*H05K 7/14* (2006.01)
(52) U.S. Cl. ..................................... 361/679.21; 349/58
(58) Field of Classification Search ............. 361/679.01, 361/679.02, 679.21, 679.22, 679.26, 679.27; 248/917–924; 349/58–60
See application file for complete search history.

(56) References Cited

U.S. PATENT DOCUMENTS

| | | | |
|---|---|---|---|
| 7,832,873 B2 * | 11/2010 | Park | 353/74 |
| 2002/0057389 A1 | 5/2002 | Ananian et al. | |
| 2003/0112379 A1 * | 6/2003 | Jung | 348/789 |
| 2007/0258203 A1 * | 11/2007 | Sturmthal | 361/683 |

FOREIGN PATENT DOCUMENTS

CN 2585517 11/2003

* cited by examiner

*Primary Examiner* — Jinhee Lee
*Assistant Examiner* — Ingrid Wright
(74) *Attorney, Agent, or Firm* — Winston Hsu; Scott Margo

(57) ABSTRACT

A display device includes a casing, a display panel assembled in the casing, and a front panel assembled at the casing to cover edges of the display panel. The front panel includes two first boards and two second boards. Each of the first boards includes a main portion and two auxiliary portions located at two sides of the main portion. The two second boards are stacked on the auxiliary portions. A method for assembling a display device is also disclosed.

16 Claims, 9 Drawing Sheets

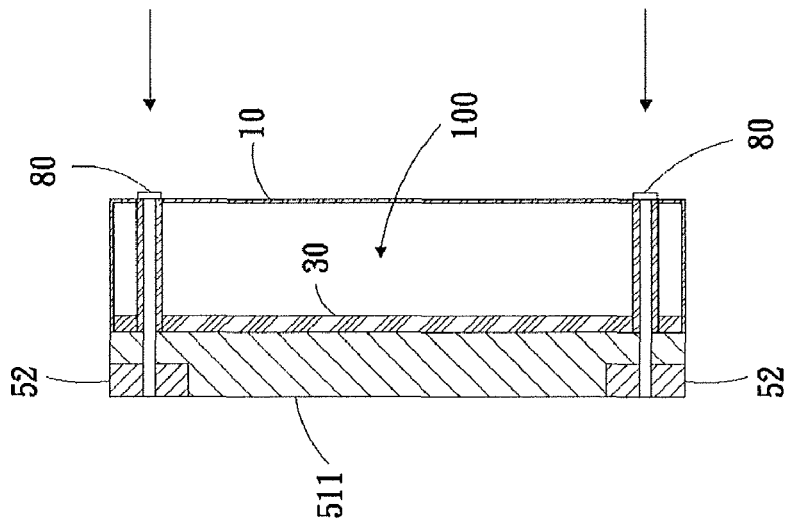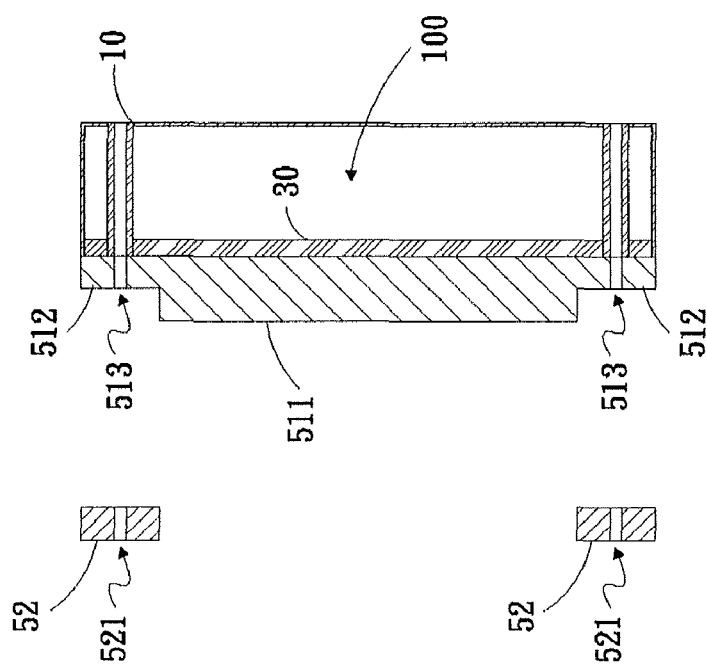

DISPLAY DEVICE AND METHOD FOR ASSEMBLING THE SAME

CROSS-REFERENCE TO RELATED APPLICATIONS

This Non-provisional application claims priority under 35 U.S.C. §119(a) on Patent Application No(s). 097142774 filed in Taiwan, Republic of China Nov. 5, 2008, the entire contents of which are hereby incorporated by reference.

BACKGROUND OF THE INVENTION

1. Field of the Invention

The invention relates to a casing and a method for assembling the same and, more particularly, to a display device and a method for assembling the same.

2. Description of the Related Art

At present, in FIG. 1, a liquid crystal display device or a plasma display device mainly includes a front frame A1, a display panel A2, and a back casing A3. The front frame A1 and the back casing A3 are integrally formed by plastic injection, respectively. During assembling, the display panel A2 and other circuit devices (not shown) are first assembled in the back casing A3, and then the front frame A1 and the back casing A3 are combined and fastened by screws. Thus, the display panel A2 and other circuit devices are disposed between the front frame A1 and the back casing A3.

With increase of a size of a display device, although the above display device has a simple structure and is easy to be assembled, a lot of costs and time are needed to develop injection molding molds to integrally form the front frame A1 and the back casing A3, respectively. Thus, the mold cost is high, material loss is high, and the component cost increases. Further, since the volume is large, the manufacture is not easy to control, which deteriorates the quality of the front frame A1 and the back casing A3 thus to greatly increase rework and repair cost. Further, universality of the device is poor, and stock control is not easy. In addition, since the sizes of the front frame A1 and the back casing A3 become larger and larger, the volume of the packing material becomes large, which is difficult for transportation further to greatly increase the transportation cost. In addition, the appearance and design of the front frame A1 and the back casing A3 which are integrally formed, respectively, is dull, and the color also does not have variety, thereby deteriorating the decoration effect and aesthetics.

BRIEF SUMMARY OF THE INVENTION

This invention provides a display device including a casing, a display panel assembled in the casing, and a front panel formed by a plurality of boards. The boards are assembled at the casing to cover edges of the display panel and to form the front panel.

The invention also provides a method for assembling a display device. The method includes the following steps. A casing and a display panel are provided. The display panel is assembled in the casing. A plurality of boards are assembled at the casing to cover edges of the display panel and to form a front panel.

In one embodiment of the invention, the boards may include two first boards and two second boards. Each of the first boards may include a main portion and two auxiliary portions located at two sides of the main portion. According to the above, in the method, the step of assembling the boards at the casing may include the step of stacking the second boards on the auxiliary portions of the first boards.

In addition, in one embodiment of the invention, the display device may further include a plurality of fastening elements. Each of the fastening elements may pass through the second board, the auxiliary portion of the first board, the display panel, and the casing thereby combining the casing, the display panel, and the front panel. In the method, the step of assembling the boards at the casing may include the step of allowing the fastening elements to pass through the second board, the auxiliary portion of the first board, the display panel, and the casing, respectively, thereby combining the casing, the display panel, and the front panel.

In one embodiment of the invention, the first boards and the second boards having different sizes may be combined to form the front panel. Thereby, in cooperation with the display panel having different size specifications, the mold does not need to be replaced to manufacture the front panel again. Thus, the stock control of the front panel becomes easier, universality of the front panel is improved, and the mold cost is reduced. In addition, by dividing the front panel into the first boards and the second boards which can be manufactured separately, the product quality can be effectively improved, and the packing and transportation cost can be reduced at the same time. In addition, the first boards and the second boards of different types or colors may be combined to form different front panels, thereby improving the decoration effect and aesthetics.

These and other features, aspects, and advantages of the present invention will become better understood with regard to the following description, appended claims, and accompanying drawings.

BRIEF DESCRIPTION OF THE DRAWINGS

FIG. 4A is a sectional schematic diagram showing a display device along a line A-A' in FIG. 3 before assembly;

FIG. 4B is a sectional schematic diagram showing a display device along the line A-A' in FIG. 3 after assembly;

DETAILED DESCRIPTION OF THE INVENTION

Figure 1:
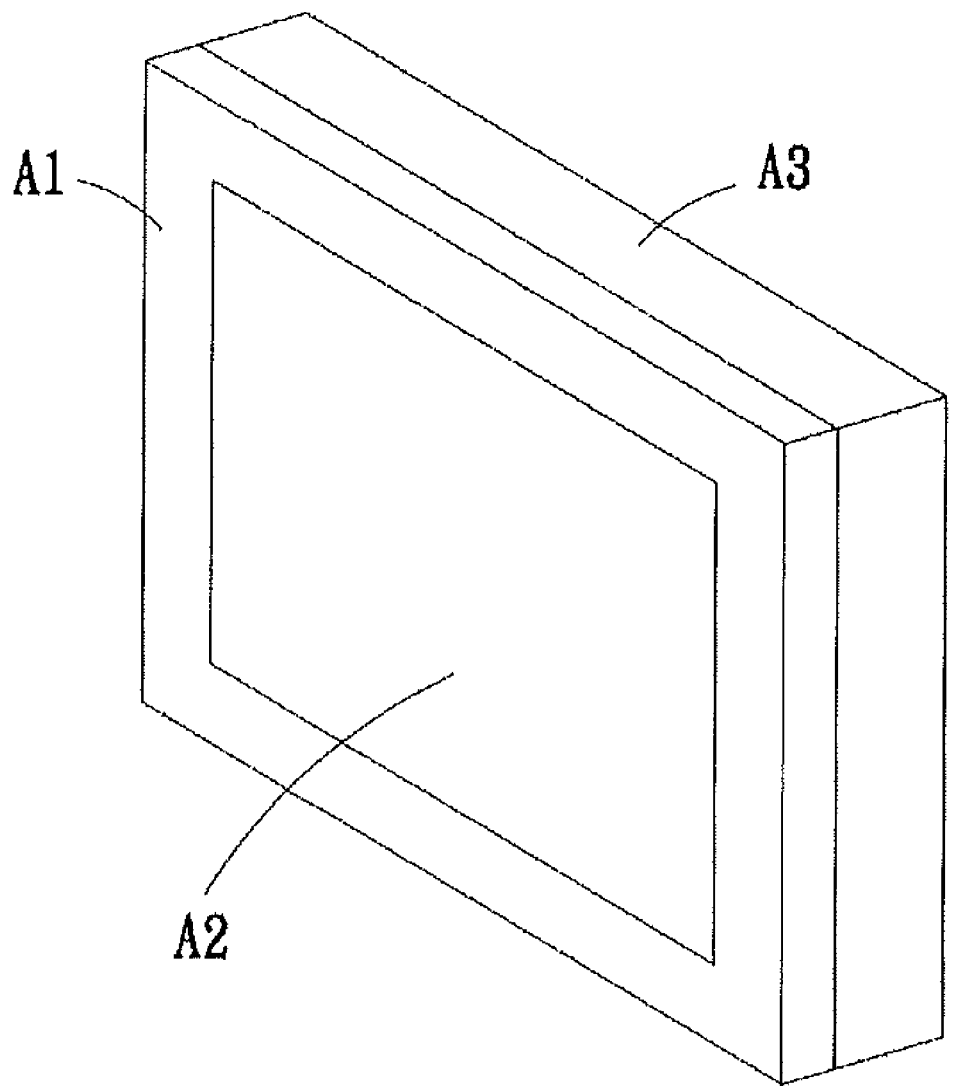
FIG. 1 is a schematic diagram showing a conventional display device.
Figure 2:
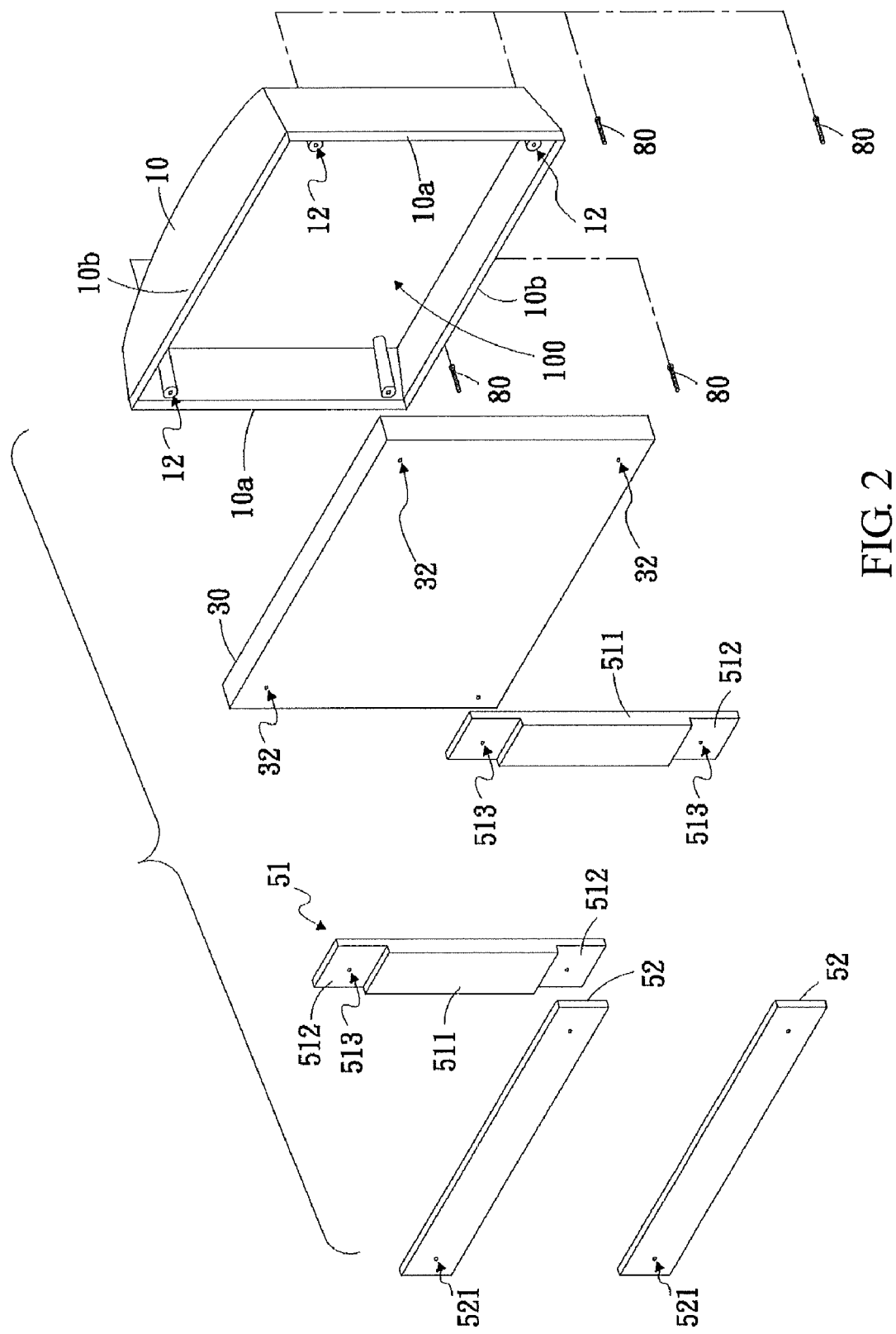
FIG. 2 is an exploded diagram showing a display device according to a first embodiment of the invention.
Figure 3:
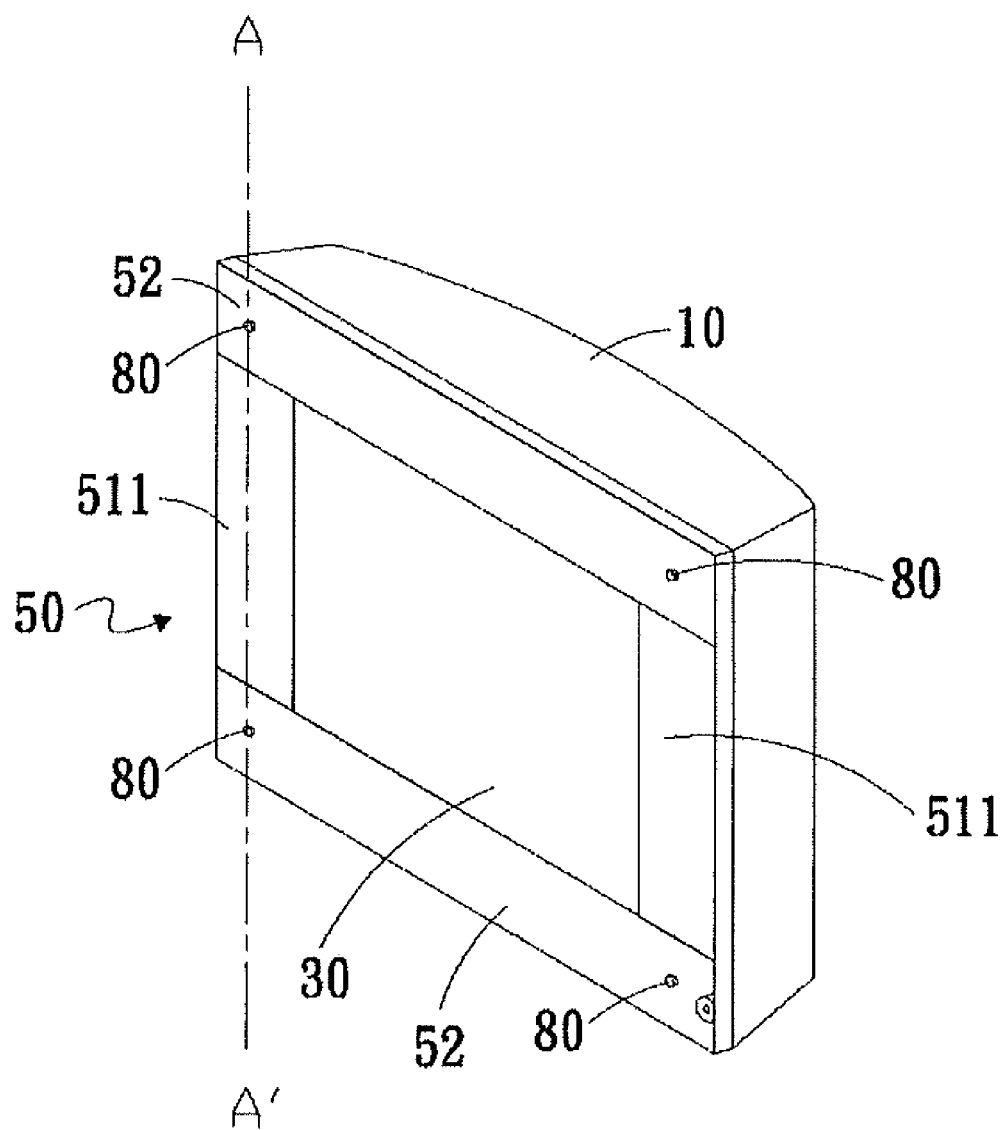
FIG. 3 is a schematic diagram showing an appearance of a display device according to the first embodiment of the invention.

Please refer to FIG. 2, FIG. 3, FIG. 4A, and FIG. 4B. According to a first embodiment of the invention, a display device includes a casing 10, a display panel 30, a front panel 50, and a plurality of fastening elements 80.

The casing 10 is rectangular and substantially has two first side edges 10a and two second side edges 10b vertical to each other to form a containing space 100. In addition, through holes 12 are disposed at four corners of the casing 10.

The display panel 30 is rectangular and is assembled in the containing space 100 of the casing 10. In this embodiment, the display panel 30 may be a liquid crystal display panel or a plasma display panel. However, the invention is not limited thereto. In addition, positioning holes 32 are disposed at four corners of the display panel 30, and the positioning holes 32 correspond to the through holes 12.

The front panel 50 is mainly formed by a plurality of boards and is assembled at the casing 10 to cover edges of the display panel 30. In this embodiment, preferably, the boards can include two first boards 51 and two second boards 52. The first board 51 has a main portion 511 and two auxiliary portions 512 respectively extending from the respective side of the main portion 511. The thickness of the main portion 511 is greater than that of the auxiliary portions 512 (as shown in FIG. 4A). After the two first boards 51 are parallelly arranged, the two second boards 52 are stacked on the auxiliary portions 512 at the two sides of the main portions 511. In addition, the first board 51 can have first through holes 513 at the auxiliary portions 512, and the first through holes 513 correspond to the positioning holes 32. The second board 52 can have second through holes 521 at two ends thereof, and the second through holes 521 correspond to the first through holes 513. In addition, the first boards 51 and the second boards 52 can be made of different materials or have different colors, decorative designs, patterns, or their combinations, thus to improve the decoration effect and aesthetics of the front panel 50.

The fastening elements 80 pass through the four corners of the casing 10. Each of the fastening elements 80 passes through the second board 52, the auxiliary portion 512 of the first board 51, the display panel 30, and the casing 10 thereby combining the casing 10, the display panel 30, and the front panel 50. In this embodiment, the fastening elements 80 can pass through the casing 10 first to combine the casing 10, the display panel 30, and the front panel 50. For example, the fastening element 80 may first pass through the through hole 12, and then it may pass through the positioning hole 32, the first through hole 513, and the second through hole 521 in turn (as shown in FIG. 4A and FIG. 4B). However, the invention is not limited thereto. The fastening elements 80 can also pass through the second board 52 first to combine the casing 10, the display panel 30, and the front panel 50. For example, the fastening element 80 may first pass through the second through hole 521, and then it may pass through the first through hole 513, the positioning hole 32, and the through hole 12 in turn.

FIGS. 5A to 5H are schematic diagrams showing a display device according to a second embodiment of the invention. Please refer to FIG. 5A to FIG. 5H. In this embodiment, to firmly combine first boards 51 and second boards 52, first positioning elements are disposed at the first boards 51, and second positioning elements capable of being combined with the first positioning elements are disposed at the second boards 52. Thus, the second boards 52 can be fastened to the auxiliary portions 512 of the first boards 51.

Figure 5B:
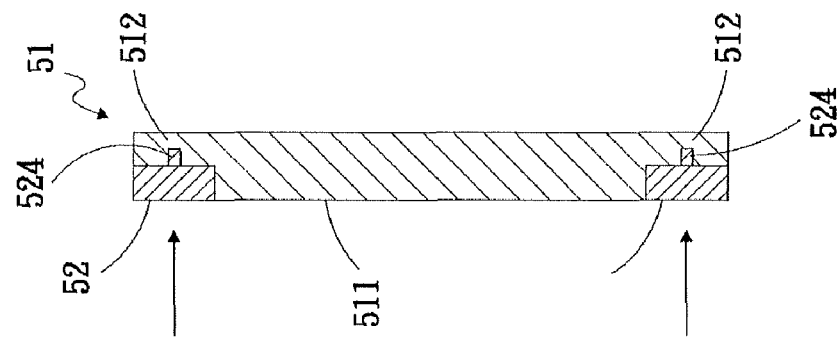
FIG. 5B is a first schematic diagram showing a front panel after assembly according to the second embodiment of the invention.
Figure 5A:
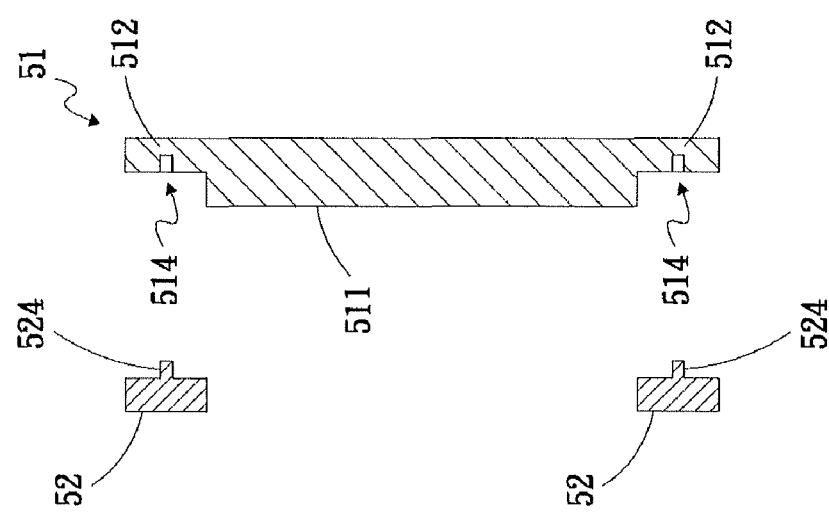
FIG. 5A is a first schematic diagram showing a front panel before assembly according to a second embodiment of the invention.
Figure 5D:
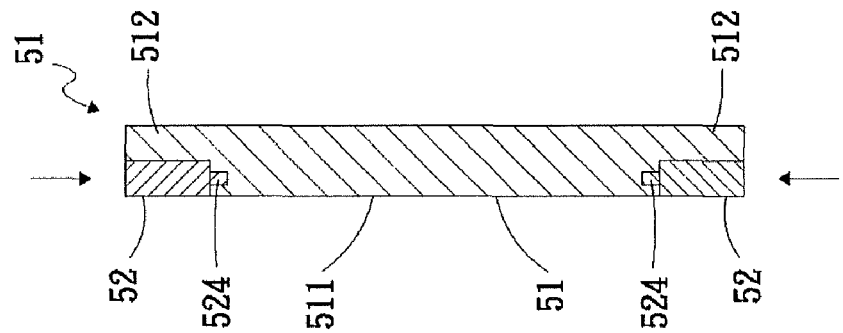
FIG. 5D is a second schematic diagram showing a front panel after assembly according to the second embodiment of the invention.
Figure 5C:
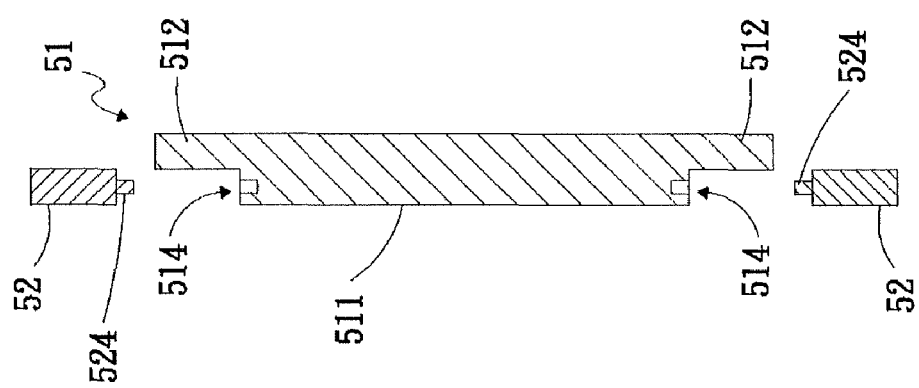
FIG. 5C is a second schematic diagram showing a front panel before assembly according to the second embodiment of the invention.

In FIG. 5A and FIG. 5B, the first positioning elements disposed at the auxiliary portions 512 of the first boards 51 are holes 514, and the second positioning elements disposed at the second boards 52 are bosses 524. In this embodiment, the respective hole 514 is disposed at the respective auxiliary portion 512, and the respective boss 524 is disposed at a surface of the respective second board 52 adjacent to the auxiliary portion 512. When the bosses 524 are embedded into the holes 514, the second boards 52 are fastened to the auxiliary portions 512 of the first boards 51. In FIG. 5C and FIG. 5D, the respective hole 514 can be disposed at the main portion 511, and the respective boss 524 can be disposed at a surface of the respective second board 52 adjacent to the main portion 511. In this embodiment, the first board 51 having the holes 514 and the second board 52 having the bosses 524 are taken for example. However, the invention is not limited thereto. The two structures can be changed or adjusted according to practical needs. For example, the first board 51 may have the bosses, and the second board 52 may have the holes.

Figure 5F:
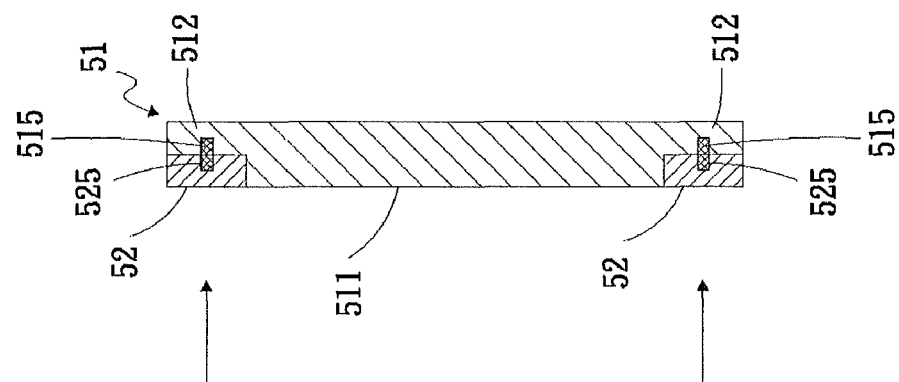
FIG. 5F is a third schematic diagram showing a front panel after assembly according to the second embodiment of the invention.
Figure 5E:
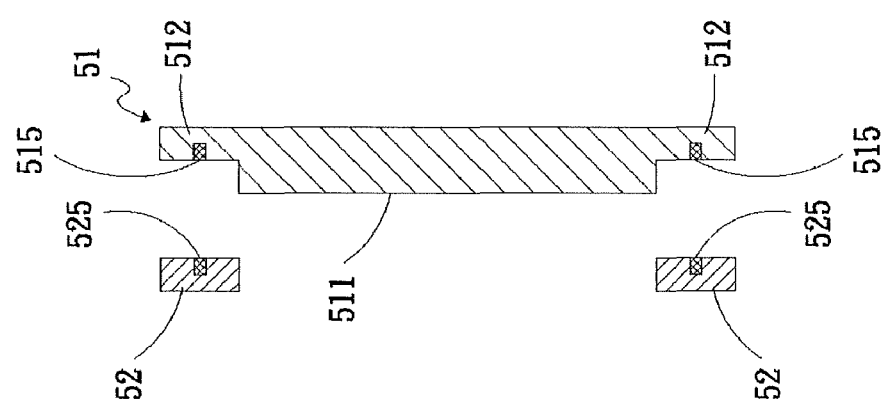
FIG. 5E is a third schematic diagram showing a front panel before assembly according to the second embodiment of the invention.

In FIG. 5E and FIG. 5F, the first positioning elements disposed at the auxiliary portions 512 of the first board 51 are first magnetic elements 515, and the second positioning elements disposed at the second board 52 are second magnetic elements 525. When the second boards 52 is stacked on the auxiliary portions 512 of the first boards 51, the first magnetic elements 515 and the second magnetic elements 525 are attracted to each other, thus to fasten the second boards 52 to the auxiliary portions 512 of the first boards 51.

Figure 5H:
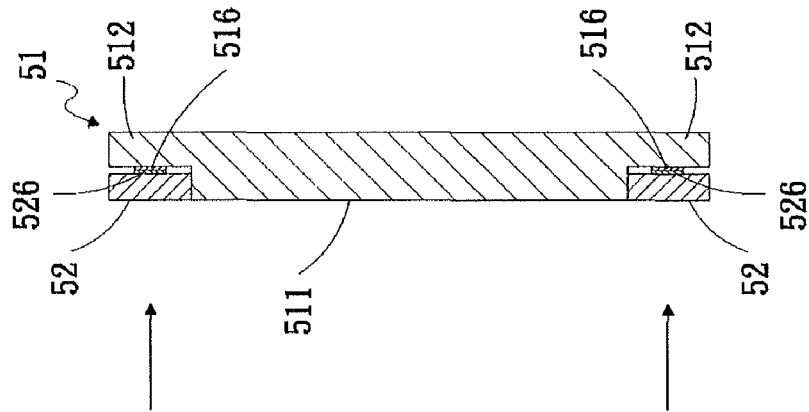
FIG. 5H is a fourth schematic diagram showing a front panel after assembly according to the second embodiment of the invention.
Figure 5G:
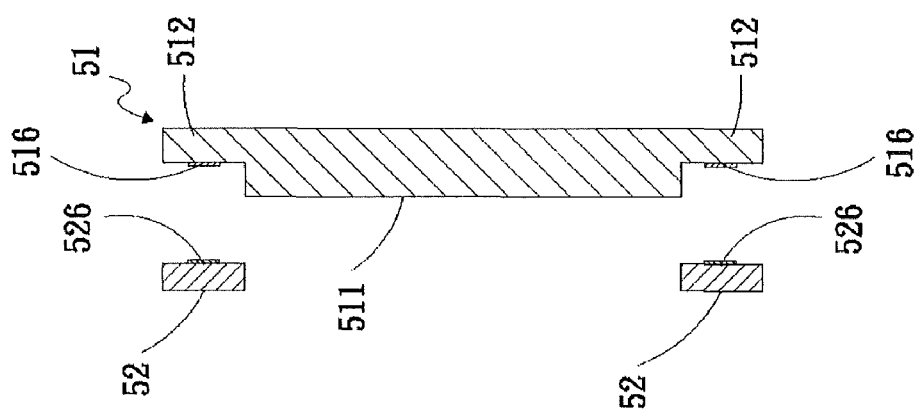
FIG. 5G is a fourth schematic diagram showing a front panel before assembly according to the second embodiment of the invention.

In FIG. 5G and FIG. 5H, the first positioning elements disposed at the auxiliary portions 512 of the first board 51 are first adhesive elements 516, and the second positioning elements disposed at the second board 52 are second adhesive elements 526. When the second boards 52 is stacked on the auxiliary portions of the first boards 51, the first adhesive elements 516 and the second adhesive elements 526 are adhered to each other, thus to fasten the second boards 52 to the auxiliary portions 512 of the first boards 51.

Figure 6:
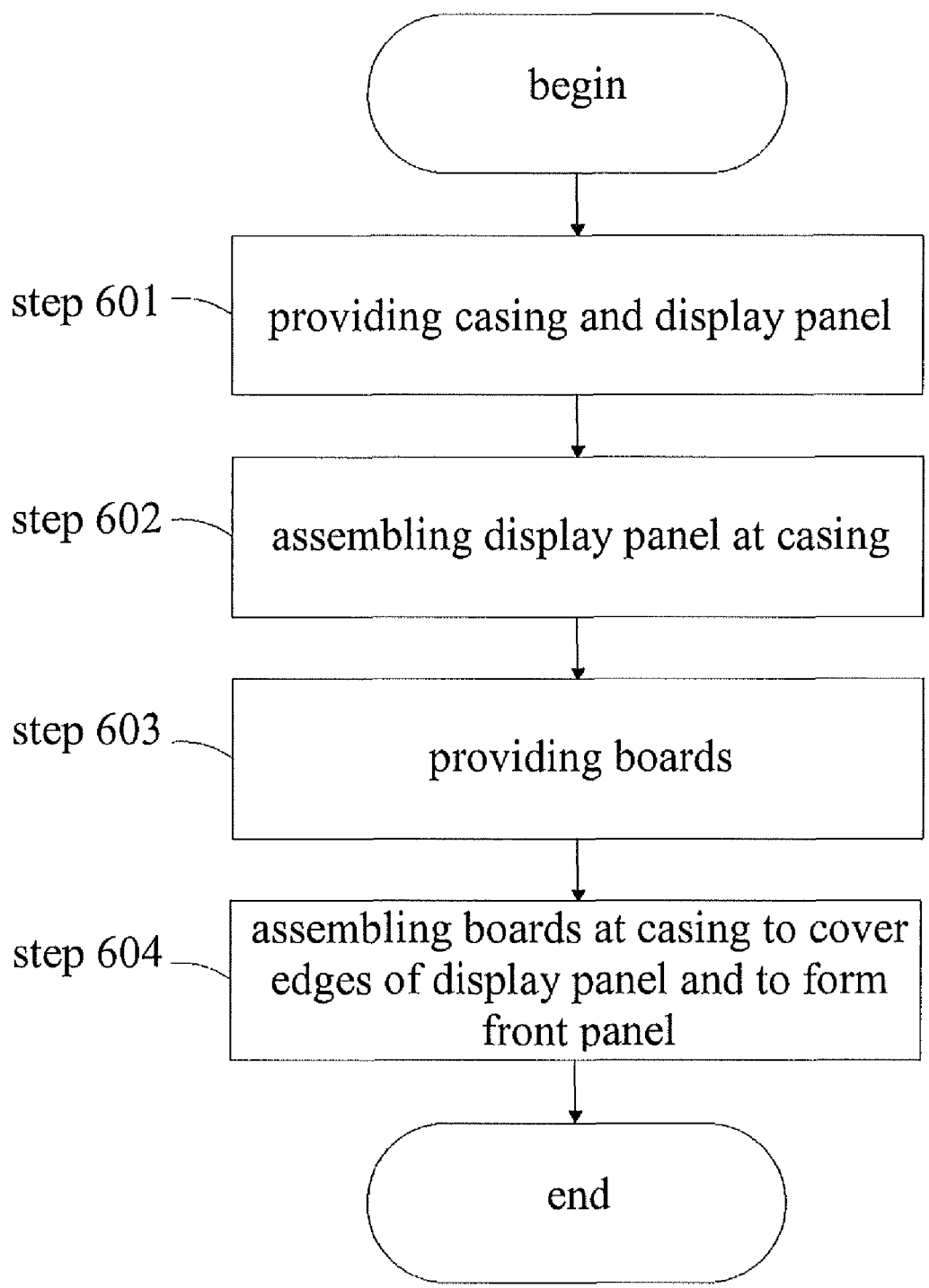
FIG. 6 is a flow chart showing a method for assembling a display device according to one embodiment of the invention.

FIG. 6 is a flow chart showing a method for assembling a display device according to one embodiment of the invention. In FIG. 6, the method includes the following steps.

Step 601: providing a casing 10 and a display panel 30.

Step 602: assembling the display panel 30 in the casing 10.

The casing 10 is rectangular and substantially has two first side edges 10a and two second side edges 10b vertical to each other to form a containing space 100 for containing the display panel 30. In this embodiment, through holes 12 are disposed at four corners of the casing 10, and positioning holes 32 are disposed at four corners of the display panel 30. The positioning holes 32 correspond to the through holes 12.

Step 603: providing a plurality of boards.

Preferably, the boards can include two first boards 51 and two second boards 52, and the two second boards 52 can be stacked on the first boards 51 to form a front panel 50.

The first board 51 has a main portion 511 and two auxiliary portions 512 respectively extending from the respective side of the main portion 511. The thickness of the main portion 511 is greater than that of the auxiliary portions 512. In this embodiment, the first board 51 can have first through holes 513 at the auxiliary portions 512, and the first through holes 513 correspond to the positioning holes 32.

After the two first boards 51 are parallelly arranged, the two second boards 52 are stacked on the auxiliary portions at the two sides of the main portions 511, thereby forming the front panel 50. In this embodiment, the second board 52 can have second through holes 521 at two ends thereof, and the second through holes 521 correspond to the first through holes 513.

In this step, to firmly combine the first boards 51 and the second boards 52, the first boards 51 have first positioning elements, and the second boards 52 have second positioning elements capable of being combined with the first positioning elements, thus to fasten the second boards 52 to the auxiliary portions 512 of the first boards 51. In this embodiment, the first positioning elements disposed at the first boards 51 and the second positioning elements disposed at the second boards 52 are the same as that described in the second embodiment of the invention in FIG. 5A to FIG. 5H. Therefore, they are not described for a concise purpose.

Step 604: assembling the boards at the casing 10 to cover edges of the display panel 30 and to form the front panel 50.

In this step, a plurality of fastening elements 80 can pass through the second board 52, the auxiliary portion 512 of the first board 51, the display panel 30, and the casing 10, respectively, thereby combining the casing 10, the display panel 30, and the front panel 50. The fastening elements 80 can first pass through one of the second board 52 or the casing 10. For example, the fastening element 80 may first pass through the through hole 12 of the casing 10, and then it may pass through the positioning hole 32, the first through hole 513, and the second through hole 521 in turn (as shown in FIG. 4A and FIG. 4B) thereby combining the casing 10, the display panel 30, and the front panel 50. On the other hand, the fastening element 80 may first pass through the second through hole 521 of the second board 52, and then it may pass through the first through hole 513, the positioning hole 32, and the through hole 12 in turn.

According to the embodiment of the invention, the first boards and the second boards are combined to form the front panel. In the assembling process, the first boards and the second boards having different sizes can be selected for combination, thus to cooperate with the display panel having different size specifications. According to the embodiment of the invention, the first boards and the second boards of different types or colors can also be used.

Although the present invention has been described in considerable detail with reference to certain preferred embodiments thereof, the disclosure is not for limiting the scope of the invention. Persons having ordinary skill in the art may make various modifications and changes without departing from the scope and spirit of the invention. Therefore, the scope of the appended claims should not be limited to the description of the preferred embodiments described above.

What is claimed is:

1. A display device comprising:
    a casing, comprising:
        two first side edges corresponding to each other; and
        two second side edges corresponding to each other;
    a display panel assembled in the casing; and
    a front panel formed by a plurality of boards and assembled at the casing to cover edges of the display panel, the plurality of boards comprising:
        two first boards located at the first side edges of the casing, each of the first boards including a main portion and two auxiliary portions located at two sides of the main portion; and
        two second boards located at the second side edges of the casing and stacked on the respective auxiliary portion.

2. The display device according to claim 1, wherein the first board further comprises at least one first positioning element, the second board further comprises at least one second positioning element, and the first positioning element and the second positioning element are combined to fasten the second board to the auxiliary portion.

3. The display device according to claim 2, wherein the first positioning element is a boss, and the second positioning element is a hole.

4. The display device according to claim 2, wherein the first positioning element is a hole, and the second positioning element is a boss.

5. The display device according to claim 2, wherein the first positioning element is a first magnetic element, and the second positioning element is a second magnetic element capable of attracting the first magnetic element.

6. The display device according to claim 2, wherein the first positioning element is a first adhesive element, and the second positioning element is a second adhesive element capable of adhering to the first adhesive element.

7. The display device according to claim 2, wherein the first positioning element is located at the main portion.

8. The display device according to claim 2, wherein the first positioning element is located at the auxiliary portion.

9. The display device according to claim 1, further comprising a plurality of fastening elements, each of the fastening elements passing through the second board, the auxiliary portion of the first board, the display panel, and the casing thereby combining the casing, the display panel, and the front panel.

10. The display device according to claim 9, wherein the casing further comprises a plurality of through holes for allowing the fastening elements to pass through.

11. The display device according to claim 10, wherein the display panel comprises a plurality of positioning holes corresponding to the through holes.

12. The display device according to claim 11, wherein the first board comprises a plurality of first through holes corresponding to the positioning holes.

13. The display device according to claim 12, wherein the second board comprises a plurality of second through holes corresponding to the first through holes.

14. A method for assembling a display device, the method comprising the following steps of:
    providing a casing and a display panel;
    assembling the display panel in the casing; and
    assembling a plurality of boards at the casing to cover edges of the display panel and to form a front panel;
    wherein the plurality of boards comprising two first boards and two second boards, each of the first boards comprises a main portion and two auxiliary portions located at two sides of the main portion, and the step of assembling the boards at the casing comprises the step of stacking the second boards on the auxiliary portions of the first boards.

15. The method for assembling a display device according to claim 14, wherein the first board has a first positioning element, the second board has a second positioning element, and the first positioning element and the second positioning element are combined.

16. The method for assembling a display device according to claim 14, wherein the step of assembling the boards at the casing comprises the step of:
    allowing a plurality of fastening elements to pass through the second board, the auxiliary portion of the first board, the display panel, and the casing, respectively, thereby combining the casing, the display panel, and the front panel.

* * * * *